United States Patent [19]

Adachi et al.

[11] Patent Number: 5,065,283
[45] Date of Patent: Nov. 12, 1991

[54] PRINTED CIRCUIT BOARD WITH BUSBAR INTERCONNECTIONS

[75] Inventors: Einosuke Adachi; Takashi Takahama; Hiroyuki Nakajima, all of Amagasaki; Tutomu Kazama; Satoru Hayashi, both of Nagoya; Kikuo Sakita, Sagamihara, all of Japan

[73] Assignee: Mitsubishi Denki Kabushiki Kaisha, Japan

[21] Appl. No.: 536,710

[22] Filed: Jun. 12, 1990

[51] Int. Cl.$^5$ .............................................. H01R 9/00
[52] U.S. Cl. .................................. 361/407; 361/400; 361/405; 361/417; 361/419; 439/84; 439/741
[58] Field of Search ............... 361/400, 405, 407, 413, 361/417, 419, 420; 439/84, 741

[56] References Cited

U.S. PATENT DOCUMENTS 2,025,619 12/1935 Scotney .............................. 361/413

Primary Examiner—Leo P. Picard
Assistant Examiner—Paramita Ghosh
Attorney, Agent, or Firm—Leydig, Voit & Mayer

[57] ABSTRACT

Printed circuit boards with busbars for providing large current interconnections are disclosed. The printed circuit board 6 has through holes through each of which a cylindrical fixture member 12 having a top nut portion 12b extends to be secured to the board 6 by means of the bottom flange 12p and the radial outward extension 12a formed by a pressing or caulking step. Each one of the leads 4 of circuit elements 3 has a pin-shaped end portion having a male thread 4a formed thereon which engages with the nut portion 12b of a fixture member, wherein the pin-shaped portion 4a of each lead extends through a through hole formed in the busbars 1 so that the busbars 1 are securely held between the fixture members 12 and the stoppers (radial extensions) 4b formed at the base of the pin-shaped portions 4a of the leads 4. Alternatively, the busbars 1 are held between two radial outward extensions 12a and 12A of each one of the fixture member (FIG. 5), or are held together with the board 6 between the flange 12p and the radial extension 12a thereof (FIG. 9). The busbars may be bent and deformed to realize a three-dimensional busbar interconnection pattern (FIG. 10).

5 Claims, 7 Drawing Sheets

PRINTED CIRCUIT BOARD WITH BUSBAR INTERCONNECTIONS

BACKGROUND OF THE INVENTION

This invention relates to printed circuit boards with busbar interconnections for carrying large currents between circuit elements mounted on the circuit board.

Busbars are utilized for making large current interconnections between circuit elements mounted on printed circuit boards. FIG. 1 shows a conventional printed circuit board utilizing busbars as large current interconnections, which is disclosed, for example, in Japanese Utility Model Application Laid-Open (Kokai) 55-77882.

In FIG. 1, busbars 1, made of slender elongated copper plates 12 mm wide and 1.2 mm thick for example, have bar ring portions 2 at respective ends thereof, each of which bar rings has a through hole 5 through which leads 4 of a circuit element 3 extends. The bar rings 2 are inserted into respective through holes formed in the board 6 of an electrically insulating material; the bar rings 2 have a height substantially equal to the thickness of the board 6 so that the lower ends of the bar rings 2 are flush, when inserted, with the lower surface of the board 6 on which printed circuit patterns 10 made of copper foil are formed. The busbars 1 are soldered to the circuit board 6 via copper foil patterns 8 formed on the board 6. The leads 4 of circuit elements 3 are inserted into the through holes 5 in the bar rings 2 and are soldered thereto by means of solder 9. Thus, the leads 4 of the elements 3 are directly soldered to the bar rings 2 of the busbars 1, so that the electrical impedances therebetween can be reduced.

However, the method of mounting the busbars and making interconnections as shown in FIG. 1 has the following disadvantage.

Namely, the bar rings 2 of the busbars 1 projecting from the busbars 1 are tapered toward their ends so as to enhance the solderability thereof, the soldering being effected at the ends of the bar rings 2; thus the electrical connection between the busbars 1 and the solder 9 is secured only at the ends of the bar rings, so that the reliability of the electrical connection between the busbars 1 and the leads 4 is low, and the impedance therebetween cannot be reduced below a certain limit. In addition, the connections between the busbars 1 and the leads 4 of the circuit elements 3 are mechanically weak and are not suited for passing large currents therethrough. Further, the busbars 1 are mounted to the printed circuit board 6 via copper foil patterns 8, which are formed on the board 6 for the sole purpose of securing the busbars 1 to the board 6; this, however, makes the production steps complicated and time-consuming, and thereby increases the production cost.

Thus, provided herein is a mounting and connecting structure of the busbars as shown in FIG. 2.

In FIG. 2, the busbars 1 have bar rings 21, which fit into the respective through holes 7 formed in the circuit board 6. The height of the bar rings 21 is equal to the thickness of the board 6 such that the upper ends of the bar rings 7 are flush with the upper surface of the board 6. Each lead 4 of circuit elements 3 has a base portion 41 of a large diameter and a pin portion 42 extending therefrom which has a diameter and a height slightly smaller (e.g., by 0.2 mm to 0.5 mm) than the inner diameter and the height, respectively, of the bar rings 21. The assembling of these parts is effected as follows: the bar rings 21 of the busbars 1 are inserted into respective through holes 7 of the board 6 from below, and then the pin portions 42 of the leads 4 are inserted from above into respective through holes in the bar rings 21; thereafter, the lower side of the board 6 to which the busbars 1 are attached is dipped into a bath of molten solder, so that the molten solder enter the gap between the bar rings 21 and the pin portions 42 of the leads 4 by means of the capillary action. Thus, the circuit elements 3 are fixedly secured to the board 6, the pin portions 42 of the leads 4 being soldered to the bar rings 21 of the busbars 1 via the solder 91.

The mounting and connecting method of the busbars as shown in FIG. 2, however, still suffer from the following disadvantages. Namely, according to the above structure, the dipping of the board into molten solder bath is necessary for securing connection between the busbars 1 and the leads 4; this increases the number of assembling steps. Further, since the temperatures of the board and the busbars rise during the immersion thereof into the molten solder bath, strains may be generated after they are cooled down, due to the difference in the coefficients of expansion of the busbars 1 and the board 6. Furthermore, the formation of bar rings 21 on the busbars 1 is a complicated and time-consuming work process, which requires a special tool for working. In addition, the printed circuit boards as produced above have the problem that, since the busbars are in close contact with the board 6, heat dissipation from the large current carrying busbars 1 can be effected only inefficiently, and hence the amount of current that can be passed through the busbars is thereby limited.

The conventional busbar structure has still another kind of problem; let us describe this problem by referring to FIG. 3, which shows a plan view of a printed circuit board which is disclosed, for example, in Japanese Utility Model Laid-Open (Kokai) 60-151186.

In FIG. 3, the circuit elements $3a$ through $3d$ are mounted on the back surface of the electrically insulating board 6, to be connected via the busbars 1 through the through holes 7 formed in the board 6. The busbar interconnection structure of FIG. 3 has the advantage that each busbar can be punched out from a single metal plate even when the circuit interconnection pattern thereof is complicated. However, when, for example, a terminal of a circuit element $3a$, whose terminals are connected to those of the neighboring element $3b$, is to be connected to a terminal of another element $3d$, a long detour $1a$ (shown by the hatches in the figure) must be formed in the busbar 1 which connects them, so that crossing of the busbars can be avoided. This makes the busbar circuit pattern complicated, and a wide area is necessary on the board for carrying the busbars thereon; as a result, the overall size of the circuit board becomes larger, and the mounting density of the circuit elements on the board is thus reduced. In addition, the punching of the complicated forms of the busbars generates much metal remains which are left in the metal plate after the busbars are cut out.

SUMMARY OF THE INVENTION

It is therefore a primary object of this invention to provide a printed circuit board provided with busbars for large current interconnections which can be produced and assembled by simple steps and which at the same time is enhanced in the electrical and mechanical reliability.

A further object of this invention is to provide such a printed circuit board whose busbars have a simple circuit pattern and which is enhanced in the mounting density of the elements mounted thereon, the circuit board thereby being reduced in overall size and weight.

The first object is accomplished in accordance with the principle of this invention by a circuit board which comprises: a board made of an electrically insulating material having a printed circuit pattern formed thereon, the board having through holes formed therein; hollow cylindrical fixture members made of an electrically conductive material, each extending through one of the through holes of the board and having a flange and a radially outwardly bent portion such that each fixture member is secured to the board held between the flange and the radially outwardly bent portion thereof, wherein each one of the fixture members comprises a nut portion at one axial end portion thereof which has a female thread formed on an inner surface thereof; and elongated rectangular plate-shaped busbars made of an electrically conductive material for carrying a large current therethrough, each busbar having through holes through each of which a bolt member made of an electrically conductive material extends to engage with the female thread of the nut portion of the fixture member, the busbars thereby being secured to the fixture member by means of the bolt members. It is preferred that the bolt members comprise leads of a circuit element, each having a radially extending stopper portion and a pin-shaped portion extending axially therefrom and having a male thread formed thereon, wherein the pin-shaped portion extends through a through hole in a busbar so as to engage at the male thread thereof with the female thread of the nut portion of one of the fixture members, the busbars being thereby securely held between the stoppers of the leads and the fixture members.

The secondly mentioned object of this invention is accomplished by a circuit board in which at least one of said busbars is bent and deformed so as to extend over and across another busbar with a separation therebetween (i.e., without making contact therewith), thereby realizing a three-dimensional large current electrical interconnection pattern on the circuit board.

The first mentioned object is also accomplished in accordance with the principle of this invention by a circuit board which comprises: a board made of an electrically insulating material having a printed circuit pattern formed thereon, the board having through holes formed therein; hollow cylindrical fixture members made of an electrically conductive material, each extending through one of the through holes of the board and having a flange and a first and a second radially outwardly bent portion such that each fixture member is secured to the board held between the flange and the first radially outwardly bent portion thereof; elongated rectangular plate-shaped busbars made of an electrically conductive material for carrying a large current therethrough, each busbar having through holes through each of which one of said fixture members extends so as to securely hold the busbar between the first and the second radially outwardly bent portions; and circuit elements having leads each with a male thread which is engaged to the female thread of the nut portion of one of the fixture members to be electrically connected to the busbars.

The first mentioned object can also be accomplished in accordance with the principle of this invention by still another circuit board which comprises: a board made of an electrically insulating material having a printed circuit pattern formed thereon, the board having through holes formed therein; elongated rectangular plate-shaped busbars made of an electrically conductive material for carrying a large current therethrough, the busbars being disposed on the board such that through holes formed therein are axially aligned with respective through holes formed in the board; hollow cylindrical fixture members made of an electrically conductive material, each extending through an axially alinged pair of the through holes of the board and the busbars and having a flange and a radially outwardly bent portion such that the board and the busbars are securely held together between the flange and the radially outwardly bent portion thereof, wherein each one of the fixture members comprises a nut portion at one axial end portion thereof which has a female thread formed on an inner surface thereof; and circuit elements having leads each with a male thread engaging with the female thread of the nut portion of one of the fixture members.

BRIEF DESCRIPTION OF THE DRAWINGS

The features which are believed to be characteristic of this invention are set forth with particularity in the appencded claims. This invention itself, however, both as to its organization and method of manufacture, together with further objects and advantages thereof, may best be understood from the detailed description of the preferred embodiments taken in conjunction with the accompanying drawings, in which:

In the drawings, like reference numerals represent like or corresponding parts.

DETAILED DESCRIPTION OF THE PREFERRED EMBODIMENTS

Referring now to FIGS. 4 through 11 of the drawings, embodiments of this invention are described.

Figure 1:
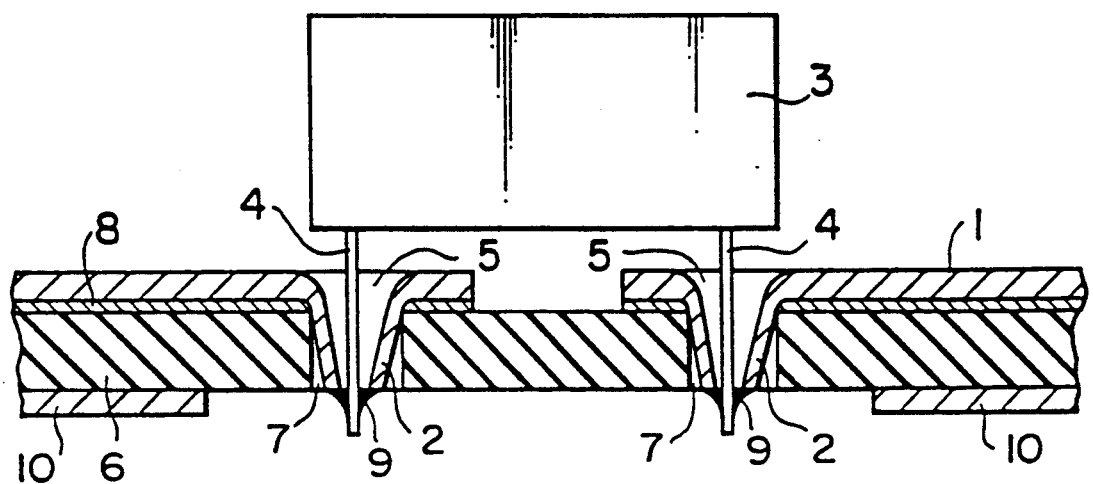
FIG. 1 is a sectional view of a conventional printed circuit board provided with busbar interconnections between circuit elements mounted on the board.
Figure 2:
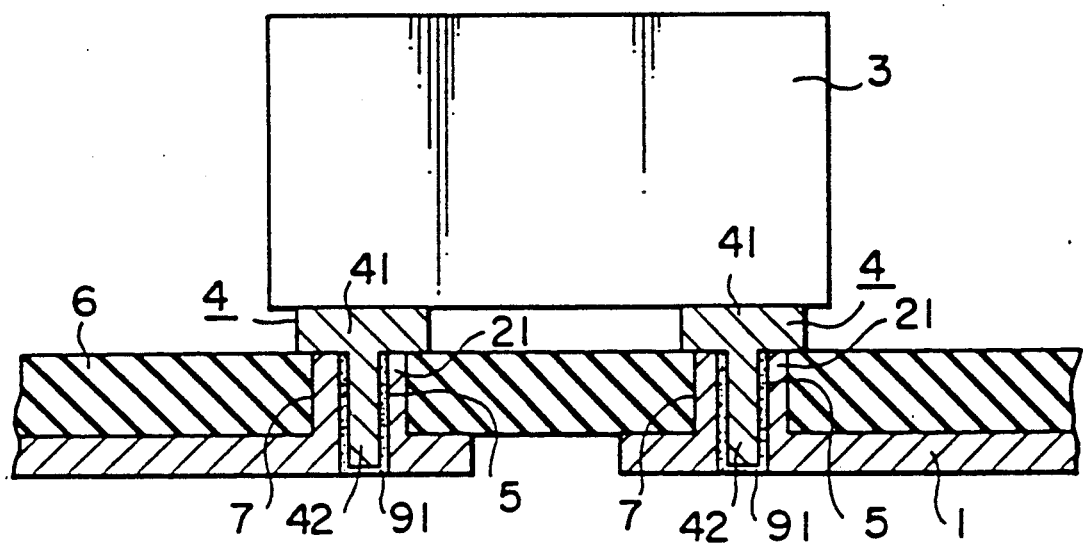
FIG. 2 is a view similar to that of FIG. 1, but showing a newly developed busbar structure.
Figure 3:
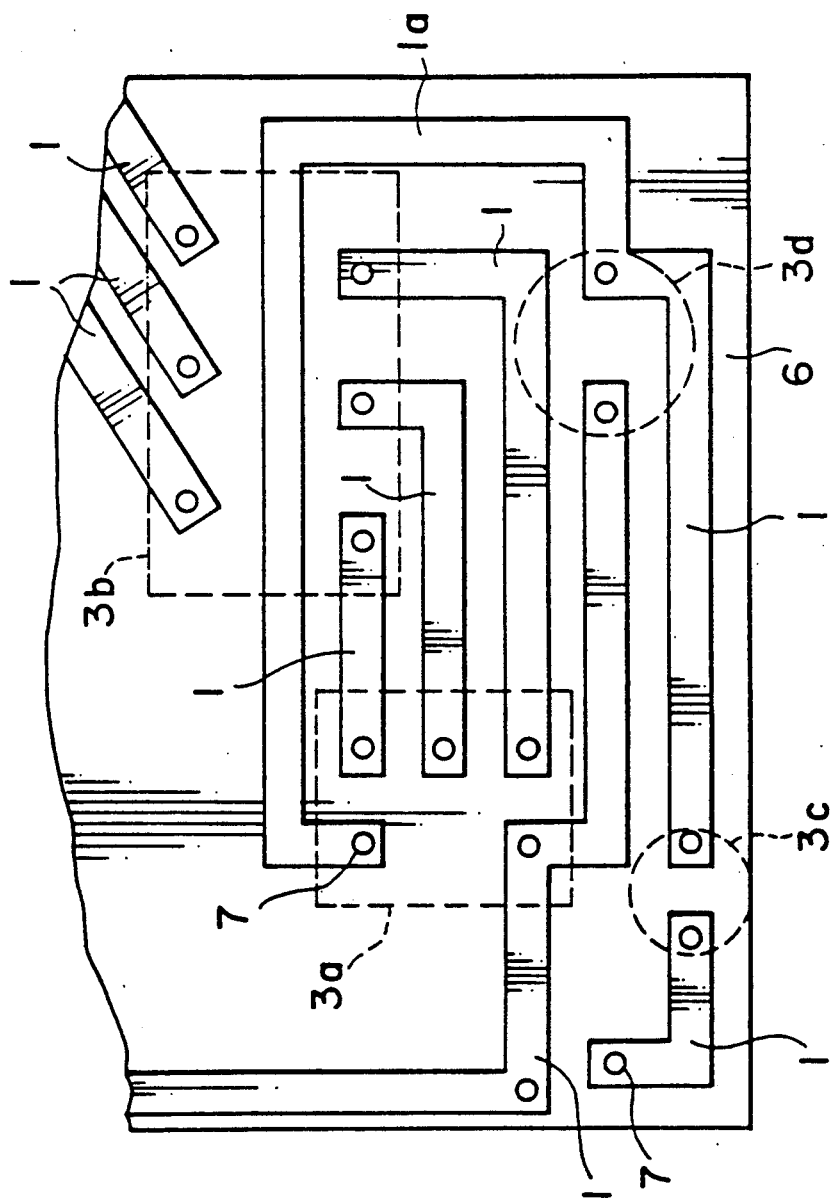
FIG. 3 is a plan view of a printed circuit board with a conventional busbar interconnection pattern.
Figure 4:
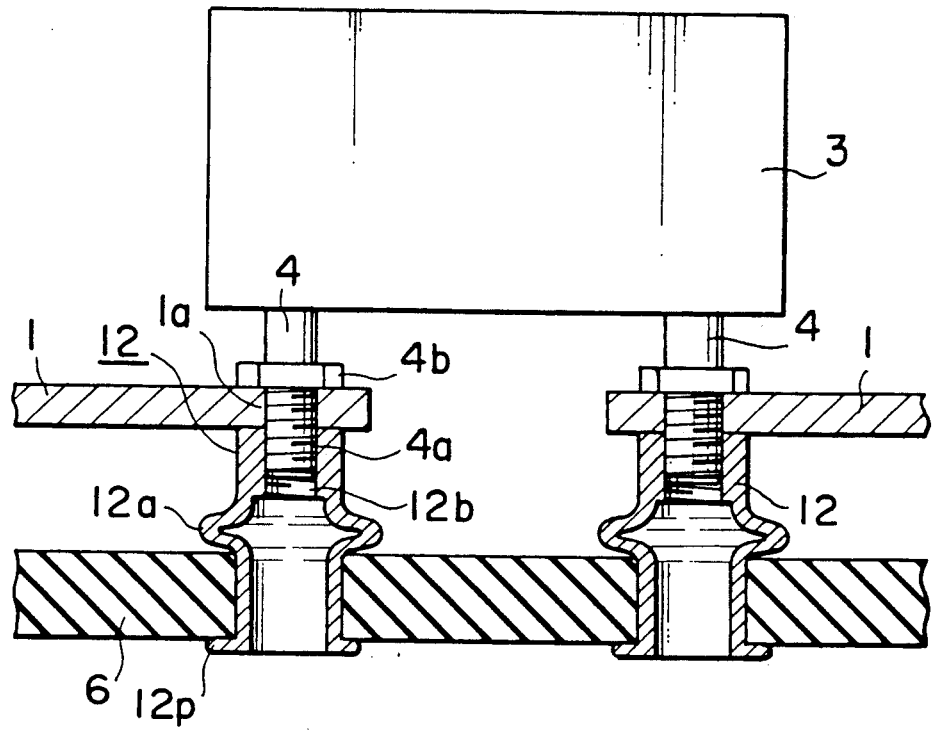
FIG. 4 is a sectional view of a printed circuit board according to a first embodiment of this invention.
Figure 6A:
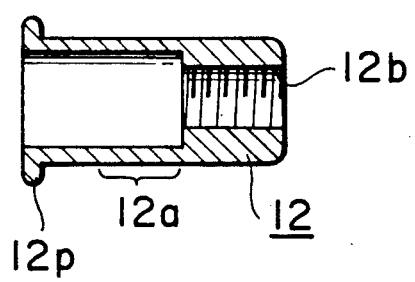
FIGS. 6a and b and 7a and b show the form and the attachment method of the insert fixture member utilized in the circuit boards of FIGS. 4 and 5, respectively.
Figure 6B:
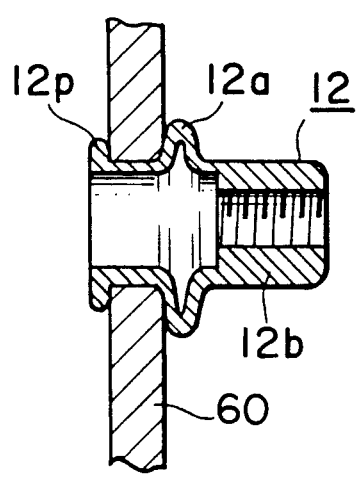

Referring first to FIG. 4, let us describe a printed circuit board provided with busbars serving as large current-carrying interconnections according to a first embodiment, wherein busbars 1, each made, for example, of a slender elongated copper plate 12 mm wide and 1.2 mm thick, are coupled to the rotatable leads 4 of circuit elements 3 via insert fixture members 12 having a top portion serving as a nut. Each hollow cylindrical insert fixture member 12, inserted in a through-hole formed in a board 6 of an electrically insulating material having a printed circuit pattern thereon, has a central radial extension (caulked or radially outwardly bent portion) 12a formed by a caulking or pressing step as described below, a top nut portion 12b having a female thread formed on the inner surface thereof, and a bottom flange 12p, wherein the fixture member 12 is secured to the board 6 by means of the central extension 12a and the bottom flange 12p. The insert fixture members 12 are made of an electrically conductive material such as brass. In the case of this embodiment, the caulking parts with a nut portion which are produced by Nihon Drivit Co. under the trade name Nutsert (Product No. 9658-5821 for M6 use) are utilized as the fixture members 12. The form of a fixture member 12 before attachment to the board 6 is shown in FIG. 6 (a); as shown therein, the lower portion (at the left side) of the hollow cylindrical fixture member 12 including the caulked portion 12a has a smaller wall thickness than the top nut portion 12b having inner female thread. On the other hand, each lead 4 has a male thread 4a formed on the pin-shaped front end portion thereof, which male thread engages with the female thread of the nut portion of the fixture member 12. Further, each one of the leads 4 comprises a stopper or radial extension 4b at the bottom of the pin-shaped portion with a male thread 4a, so that the busbar 1, into whose through holes 1a the front end portions of the leads 4 extend, is held securely between the stopper 4b and the top end of the fixture member 12.

The assembling of the parts as described above is effected as follows. First, the fixture members 12, having a form as shown in FIG. 6 (a), are inserted into respective through holes in the board 6; these through holes are formed in the board 6 to have an inner diameter greater than the outer diameter of the fixture members 12 by about 0.1 mm. Then, the fixture members 12 are subjected to the caulking step, i.e., are pressed in the axial direction from the top and the bottom thereof to form radial extensions (radially outwardly bent portions) 12a, so that the fixture members 12 are secured to the board 6. This caulking is effected by a work tool specifically adapted for the purpose. Thereafter, the through holes formed in the busbars 1 have an inner diameter greater than the outer diameter of the male thread portion of the lead 4 by 0.1 mm are aligned on top of respective fixture members 12, and the male threaded portion 4a of each lead 4 is screwed into the nut portion 12b of a fixture member 12 so that the female thread of the nut portion 12b of each fixture member 12 is engaged with the male thread 4a of a lead 4, the busbars 1 being thereby held and secured between the stoppers 4b of the leads 4 and the fixture members 12.

Thus, according to this embodiment, the fixture members 12 are secured to the circuit board 6 by the caulking step, the busbars 1 being securely held between the stoppers 4b of the leads 4 and the fixture members 12 whose nut portions engage with the male threads 4a of the leads 4. As a result, the parts are securely held to each other and the mechanical strength of the assembled circuit board is enhanced. Further, since the contact area of the leads 4 and the busbars 4 is large, the stoppers 4b of the leads 4 and the busbars 1 being in contact at a surface rather than at a point, the electrical impedance between the busbars 1 and the leads 4 is reduced and large currents can be passed through the busbars 1 with enhanced reliability. In addition, since the busbars 1 are separated from the surface of the board 6, the dissipation of the Joule heat from the busbars 1 is facilitated and the bending of the busbars 1 resulting therefrom can be effectively prevented, the thermal reliability of the circuit board being thereby enhanced. Furthermore, the steps for forming bar rings of complicated configuration on the busbars 1 and for forming copper foil patterns on the board for fixing the busbars 1 thereon, which steps were necessary in the case of conventional devices, can be dispensed with; hence, the production of the circuit board is simplified to reduce the production cost and to enhance the productivity thereof.

Figure 5:
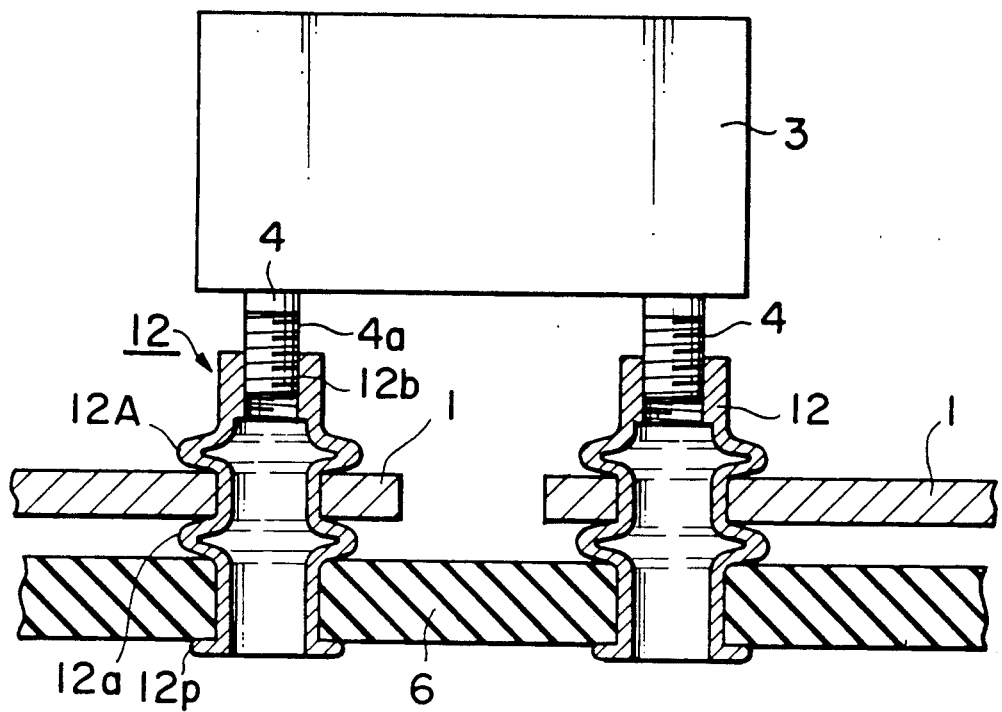
FIG. 5 is a view similar to that of FIG. 4, but showing a second embodiment.

Referring next to FIG. 5 of the drawings, let us described a second embodiment of this invention.

Figure 7A:
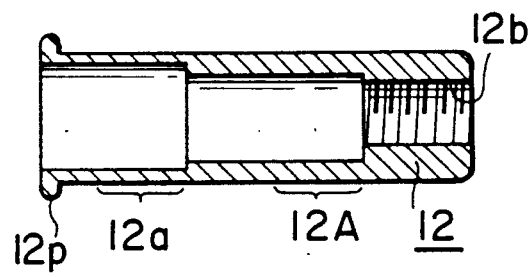
Figure 7B:
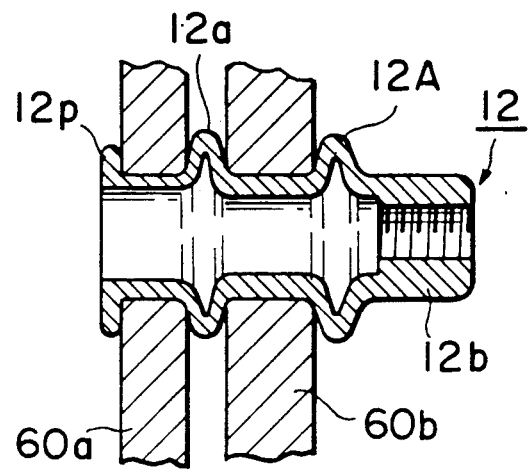

In the case of the second embodiment shown in FIG. 5, hollow cylindrical insert fixture members 12 having a form as shown in FIG. 7 (a), which have been developed by the inventors of this invention, is utilized. As shown in FIG. 5, each fixture member 12, extending through a through hole formed in the circuit board 6 and that formed in a busbar 1, is secured to the board 6 by means of a bottom flange 12p and a first caulked portion (radially outwardly bent portion) 12a, the busbar 1 being securely held between the first 12a and the second radially outwardly bent portion 12a. The male thread 4a formed on each one of the leads 4 engages with the female thread formed on the inner surface of the top nut portion 12b of the fixture member 12.

The insert fixture member 12 utilized in the circuit board of FIG. 5 has a form as shown in FIG. 7 (a) before assembly; thus, the fixture member 12 comprises: a bottom flange 12p, a lower portion (bottom one third) having a thin wall thickness including the first caulked portion 12a, a middle portion of an intermediate wall thickness including a second caulked portion 12a, and a top nut portion 12c of a large wall thickness having a female thread formed on the inner surface thereof. Let us describe the caulking operation effected by means of the fixture members 12 by reference to FIG. 7 (b). First, through holes having an inner diameter greater than the outer diameter of the insert fixture member 12 by about 0.1 mm are formed in the structural members 60a and 60b (which correspond to the board 6 and a busbar 1 of FIG. 5, respectively). Then, the fixture member 12 is inserted into the through hole in the first structural member 60a shown at the left (corresponding to the board 6 in FIG. 5) until the flange 12p abut on the periphery of the through hole. Thereafter, the both ends of the fixture member 12 is pressed by a pressing tool in the axial direction toward each other so as to form the first radial extension 12a, thereby securing the fixture member 12 to the first structural member 60a. Next, the fixture member 12 is inserted into the through hole in the second structural member 60b (corresponding to a busbar 1 in FIG. 5) until the radial extension 12a abut on the periphery of the through hole in the second structural member 60b. Thereafter, the both ends of the fixture member 12 is pressed toward each other by the pressing tool so as to form the second radial extension 12a, thereby securing to fixture member 12 the second structural member 60b. It should be noted that since, as shown in FIG. 7 (a), the second caulked portion 12a has a wall thickness greater than the wall thickness of the first caulked portion 12a, the second caulked portion 12a is not caulked (i.e., bent radially outwardly) during the first caulking operation in which the first radial extension 12a is formed. Incidentally, FIG. 6 (b) shows a fixture member 12 utilized in the first embodiment as attached to a structural member 60 corresponding to the board 6 in FIG. 4.

The above first and second embodiments shown in FIGS. 4 and 5 can be modified in a variety of ways. In the case of the first embodiment, for example, each one of the fixture members 12 may comprise a second nut portion extending axially from the flange 12p, by means of which portion the circuit elements 3 may be attached to the side of the board 1 opposite to the side to which busbars 1 are attached, the busbars 1 being attached on top of the fixture members 12 by means of independent bolts. In the case of the second embodiment, on the other hand, the nut portion 12b of the fixture members 12 may be formed at the side at which the flange 12p is formed, to extend axially downward therefrom, so that the circuit elements 3 may be attached to the side of the board 6 opposite to the side to which the busbars 1 are attached.

Figure 8:
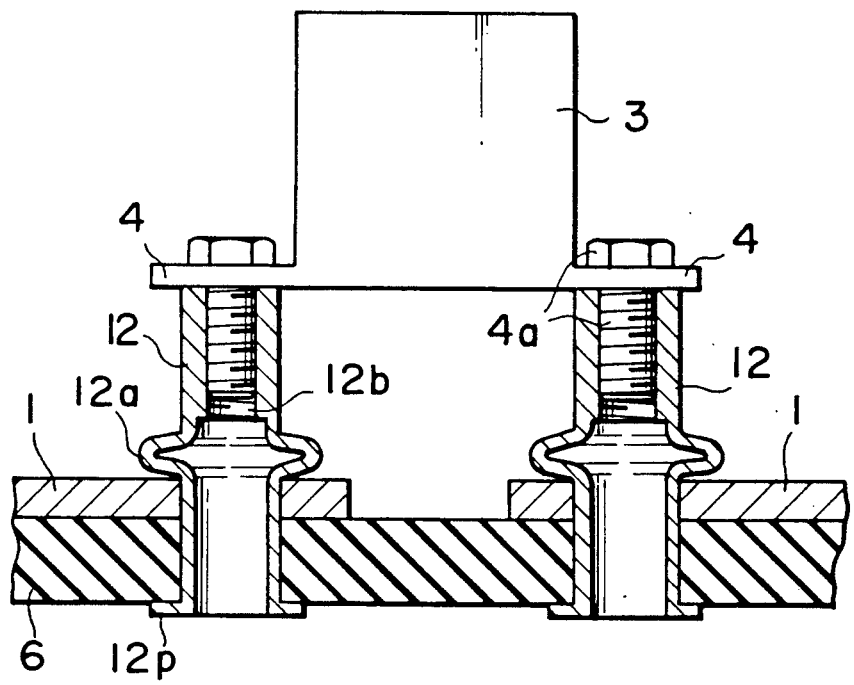
FIGS. 8 and 9 are views similar to that of FIG. 4, but showing a third and a fourth embodiment.
Figure 9:
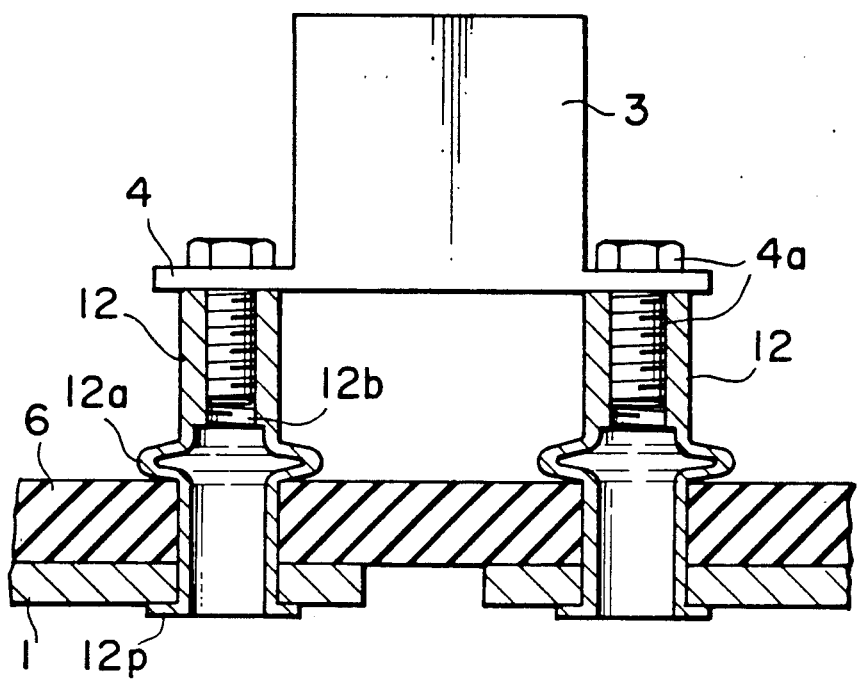

Referring next to FIGS. 8 and 9 of the drawings, let us describe a third and a fourth embodiment according to this invention.

In the case of the third embodiment shown in FIG. 8, the busbars 1 are positioned on the upper surface of the board 6 such that the through holes thereof are aligned with respective through holes of the board 6, the fixture members 12 extending through axially aligned pairs of the through holes in the board 6 and the busbars 1 to hold the board 1 and the busbars 1 together between the bottom flange portion 12p and the radial extension (caulked portion) 12a thereof. The circuit element 3 having leads 4 is attached on top of the fixture members 12 by means of the screws or bolts 4a of the leads 4. The fixture members 12 have substantially the same form as shown in FIG. 6 (a) and are caulked in substantially the same manner as in the case of the first embodiment described above.

In the case of the fourth embodiment, on the other hand, the busbars 1 are positioned on the lower surface of the board 1 so that the circuit elements 3 and the busbars 1 are at the respective opposite sides of the board 6. When preferred, the features of FIGS. 8 and 9 may be combined so that the busbars are disposed on both the upper and the lower surface of the board 6.

Figure 10:
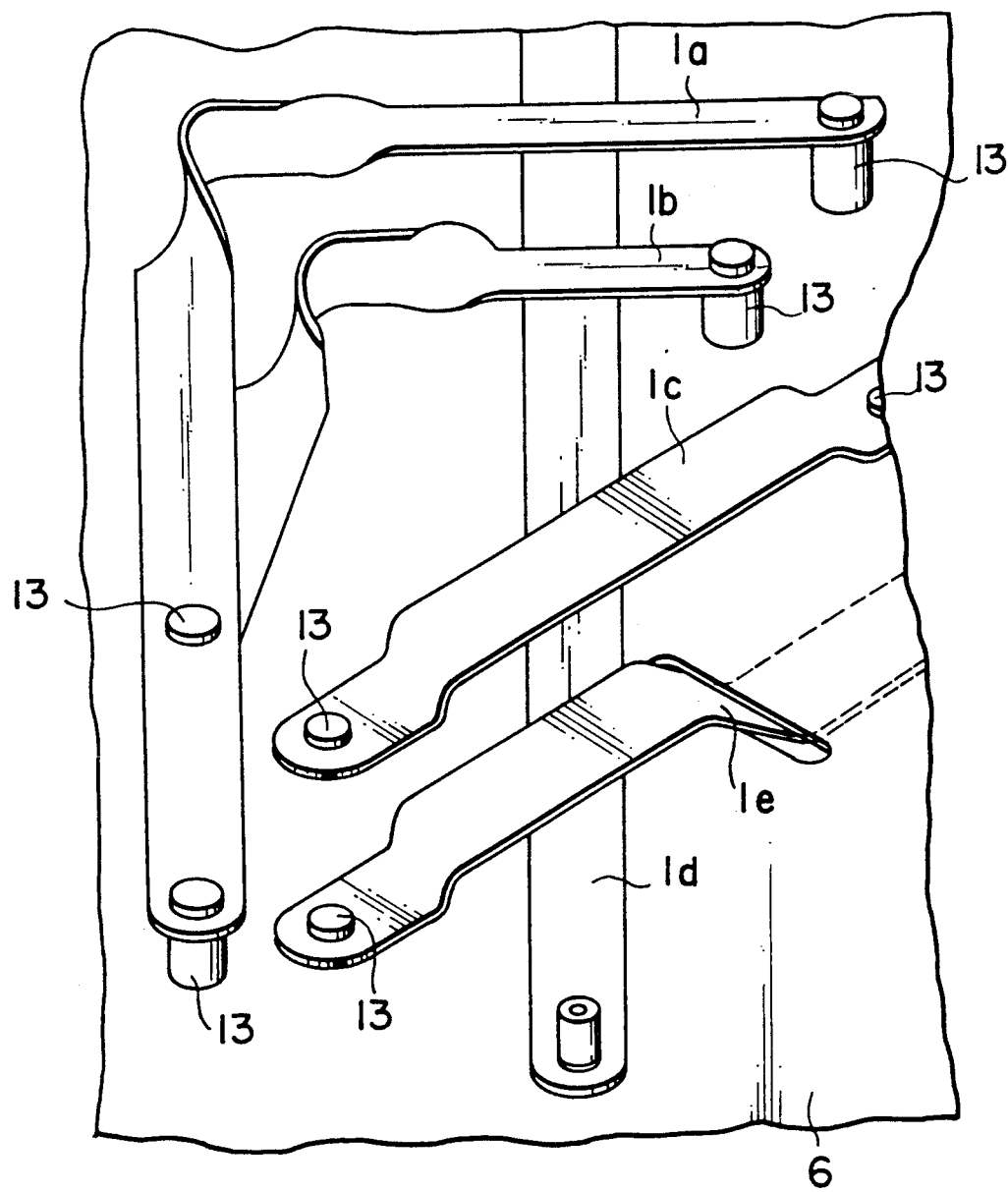
FIG. 10 is a plan view similar to that of FIG. 3, but showing a three-dimensional busbar pattern according to this invention.
Figure 11:
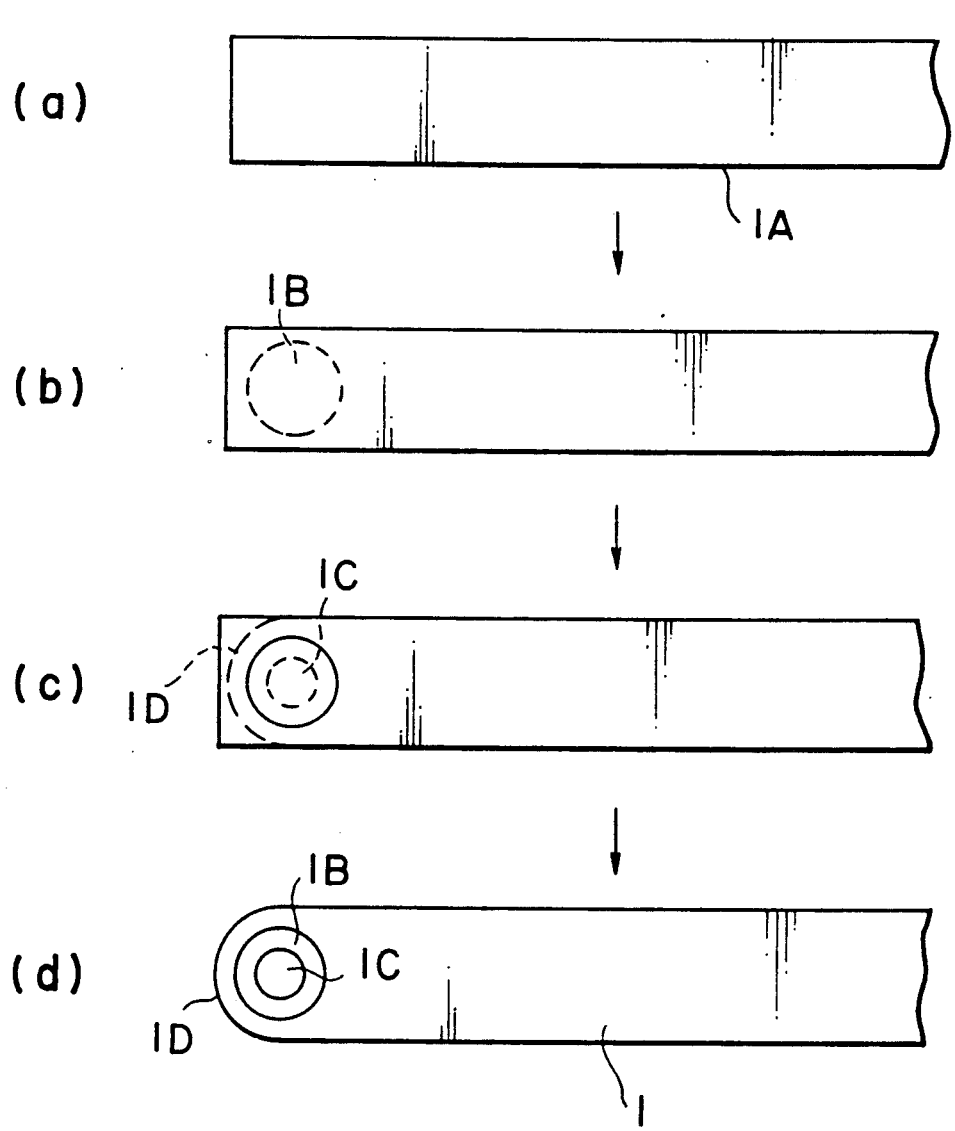
FIGS. 11a, b, c and d illustrate the steps for producing a busbar utilized in the circuit board shown in FIG. 10.

Referring next to FIGS. 10 and 11 of the drawings, let us describe a fifth embodiment, wherein FIG. 10 shows the configuration of the busbars interconnection pattern while FIG. 11 illustrates the steps for producing the busbars utilized in the embodiment.

A busbar utilized in the embodiment shown in FIG. 10 is produced as follows: First, a slender elongated rectangular plate-shaped copper wire 1A, as shown in FIG. 11 (a), is covered with an electrically insulating coating. A copper wire produced by Mitsubishi Cable Industries, Ltd. (Mitsubishi Densen Kogyo) under a trade name of MEDIS (type EDW-E:1.2 X12, according to JIS (Japanese Industrial Standard) C3140) may be utilized as the rectangular copper wire 1A. Then, the insulating coatings on both the upper and lower sides of the contact portions, shown by a dotted circle 1B in FIG. 11 (b), are removed by a well-known mechanical or chemical method. Next, a through hole 1C and a semi-circular edge 1D are cut out simultaneously by means of a press as shown in FIG. 11 (c) and (d). Thereafter, the rectangular copper wire 1A is cut to a predetermined length from the end thus formed, and the other end of the rectangular copper wire 1A is cut in a manner similar to the above, thereby obtaining a busbar 1 having the fundamental form, which can be utilized in the embodiment of FIG. 10 after being subjected, if necessary, to additional work steps.

Thus, the busbar 1a, which connects the three terminals 13 and extends over another busbar 1d with a separation being formed therebetween as shown in FIG. 10, is obtained by bending at the middle a busbar 1 as produced above; since it becomes increasingly difficult to bend the rectangular busbar 1 within the original plane thereof (i.e., within the plane of the drawing sheet in FIG. 11) as the thickness and the width of the busbar 1 increase, the busbar 1 is bent at the predetermined position as shown in FIG. 10 before being attached to the board 6 by means of the terminals 13, such that the busbar 1a is twisted by 180 degrees at the bent portion, the widthwise direction of which portion forms right angles with the surface of the board 6 when the busbar 1a is attached thereto. Further, the branching busbar 1b connecting two terminals 13 and extending over the busbar 1d with a separation being formed between the two busbars 1b and 1d can be formed by a slight modification of the busbar 1a. It is to be noted that the above busbars 1a and 1b are disposed above and separated from the surface of the board 6 while the busbar 1d is in contact with the surface of the board 6. On the other hand, the middle portion of the busbar 1c is bent upward to be raised from the surface of the board 6 so that the busbar 1c may connect the two terminals 13 across the busbar 1d without making contact therewith. Further, the busbar 1e, also jumping above the busbar 1d, extends from the front to the rear surface of the board 6 through a through hole 14 formed in the board 6, so as to connect the terminal 13 at the front surface to that on the rear. The terminals 13 may consist of the fixture members 12 as described above. Further, the busbars 1 may be coated with an insulating coating at the last stage of their production or even after they are mounted to the circuit board.

While description has been made of the particular embodiments of this invention, it will be understood that many modifications may be made without departing from the spirit thereof; the appended claims are contemplated to cover any such modifications as fall within the true spirit and scope of this invention.

What is claimed is:
1. A circuit board comprising:
   a board made of an electrically insulating material having a printed circuit pattern formed thereon, the board having through holes formed therein;
   hollow cylindrical fixture members made of an electrically conductive material, each extending through one of the through holes of the board and having a flange and a radially outwardly bent portion such that each fixture member is secured to the board held between the flange and the radially outwardly bent portion thereof, wherein each one of the fixture members comprises a nut portion at one axial end portion thereof which has a female thread formed on an inner surface thereof; and
   elongated rectangular plate-shaped busbars made of an electrically conductive material for carrying a large current therethrough, each busbar having through holes through each of which a bolt member made of an electrically conductive material extends to engage with the female thread of the nut portion of the fixture member, the busbars thereby being secured to the fixture member by means of the bolt members.

2. A circuit board as claimed in claim 1, wherein the bolt members comprise leads of a circuit element, each having a radially extending stopper and a pin-shaped portion extending axially therefrom and having a male thread formed thereon, wherein the pin-shaped portion extends through a through hole in a busbar so as to engage at the male thread thereof with the female thread of the nut portion of one of the fixture members, the busbars being thereby securely held between the stoppers of the leads and the fixture members.

3. A circuit board as claimed in claim 1, wherein at least one of said busbars is bent and deformed so as to extend over and across another busbar with a separation formed therebetween, thereby realizing a three-dimensional large current electrical interconnection pattern on the circuit board.

4. A circuit board comprising:

a board made of an electrically insulating material having a printed circuit pattern formed thereon, the board having through holes formed therein;

hollow cylindrical fixture members made of an electrically conductive material, each extending through one of the through holes of the board and having a flange and a first and a second radially outwardly bent portion such that each fixture member is secured to the board held between the flange and the first radially outwardly bent portion thereof;

elongated rectangular plate-shaped busbars made of an electrically conductive material for carrying a large current therethrough, each busbar having through holes through each of which one of said fixture members extends so as to securely hold the busbar between the first and the second radially outwardly bent portions; and circuit elements having leads each with a male thread engaged to a nut portion of one of the fixture members to be electrically connected to the busbars.

5. A circuit board comprising:

a board made of an electrically insulating material having a printed circuit pattern formed thereon, the board having through holes formed therein;

elongated rectangular plate-shaped busbars made of an electrically conductive material for carrying a large current therethrough, the busbars being disposed on the board such that through holes formed therein are axially aligned with respective through holes formed in the board;

hollow cylindrical fixture members made of an electrically conductive material, each extending through an axially aligned pair of the through holes of the board and the busbars and having a flange and a radially outwardly bent portion such that the board and the busbars are securely held together between the flange and the radially outwardly bent portion thereof, wherein each one of the fixture members comprises a nut portion at one axial end portion thereof which has a female thread formed on an inner surface thereof; and circuit elements having leads each with a male thread engaging with the female thread of the nut portion of one of the fixture members.

* * * * *